United States Patent [19]

Fletcher et al.

[11] E Patent Number: Re. 31,774

[45] Reissued Date of Patent: Dec. 18, 1984

[54] MEASURING SYSTEM

[75] Inventors: David L. Fletcher; Walter O. Stadlin, both of North Wales, Pa.

[73] Assignee: Leeds & Northrup Company, North Wales, Pa.

[21] Appl. No.: 532,347

[22] Filed: Sep. 15, 1983

Related U.S. Patent Documents

Reissue of:

[64] Patent No.: 4,240,149
Issued: Dec. 16, 1980
Appl. No.: 12,632
Filed: Feb. 16, 1979

[51] Int. Cl.[3] ..... G06F 15/20
[52] U.S. Cl. ..... 364/483; 324/94
[58] Field of Search ..... 364/483; 324/94

[56] References Cited

U.S. PATENT DOCUMENTS 4,139,896 2/1979 Finger ..... 364/483 X

FOREIGN PATENT DOCUMENTS 1475818 6/1977 United Kingdom ..... 364/483

*Primary Examiner*—Edward J. Wise
*Attorney, Agent, or Firm*—William G. Miller, Jr.; Harold Huberfeld

[57] ABSTRACT

There is provided a method for measuring a parameter whose value is calculable as an integral with time of a function of at least one variable so as to make possible the use of a microprocessor when measurements of such variables are desired. The variable is sampled periodically at a frequency asynchronous with the wave form which the variable follows and then there is periodically calculated the value of the function by summing the values for the function determined by the samples taken during the time between the calculations, thus determining the desired integral.

5 Claims, 2 Drawing Figures

MEASURING SYSTEM

Matter enclosed in heavy brackets [ ] appears in the original patent but forms no part of this reissue specification; matter printed in italics indicates the additions made by reissue.

BACKGROUND OF THE INVENTION

This invention relates to a method for measuring a parameter whose value is calculable as an integral with time of a function of at least one variable. The method of this invention makes possible the use of a microprocessor when measurements such as effective (RMS) voltage, effective (RMS) current, average power, and energy are to be made by calculation from the outputs of current and potential transformers.

Use of a microprocessor for making the required measurements from current and potential transformer outputs has the advantage over previously known methods in that there is not required the use of separate measuring devices for each of the measurements and the microprocessor provides an output which can be transmitted to a central computer for use.

SUMMARY OF THE INVENTION

The method of this invention comprises a first step of sampling the value of the variable of which the parameter being measured is a function. *other than the identity function of a single variable.* The sampling is done periodically at a frequency asynchronous with the wave form of the variable *and not a harmonic or subharmonic of the waveform.* Periodically there is then made a calculation of the value of the function by summing the values for the function determined from the values for the variable obtained for each sample taken during the time between calculations.

DESCRIPTION OF THE PREFERRED EMBODIMENTS

The theoretical basis for this measuring method is found in the fact that an exact integral equation can be approximated by a finite summation equation as follows:

$$y = \int_0^T x\,dt \approx \sum_{n=1}^{N} x_n \Delta t_n$$

where y is the parameter being measured and x is some function of the variable which when integrated over the period T gives the value for the parameter. N is the number of samples made between calculations (during period T) and $\Delta t_n$ is the sample period. The period between samples becomes $\Delta t_n \approx T/N$. Obviously the larger the number of samples and the smaller the sample period the closer the finite sum approximates the integral.

Where the variable or variables which determine the parameter have values which follow a periodic wave form, a number of samples of the value of those variables is made during each period of the wave form with the frequency of the samples being asynchronous with the frequency of the variable. Therefore, with respect to the variable there is obtained a sliding sample so that over a period of time all parts of the wave form of the variable are sampled. It is, of course, important to use a large number of samples if the wave form of the variable is not symmetrical about the average, whereas a smaller number of samples suffices if the wave form is symmetrical.

It is convenient to utilize a microprocessor for calculating the required function of the variable to obtain a calculation of the value for the parameter being measured. Thus, it is possible to measure parameters of a 60 hertz power system by utilizing the standard current and potential transformers to provide inputs to a microprocessor through analog to digital converters so that the inputs provide the data required to calculate parameters such as RMS voltage, RMS current, average power, and energy.

Figure 1:
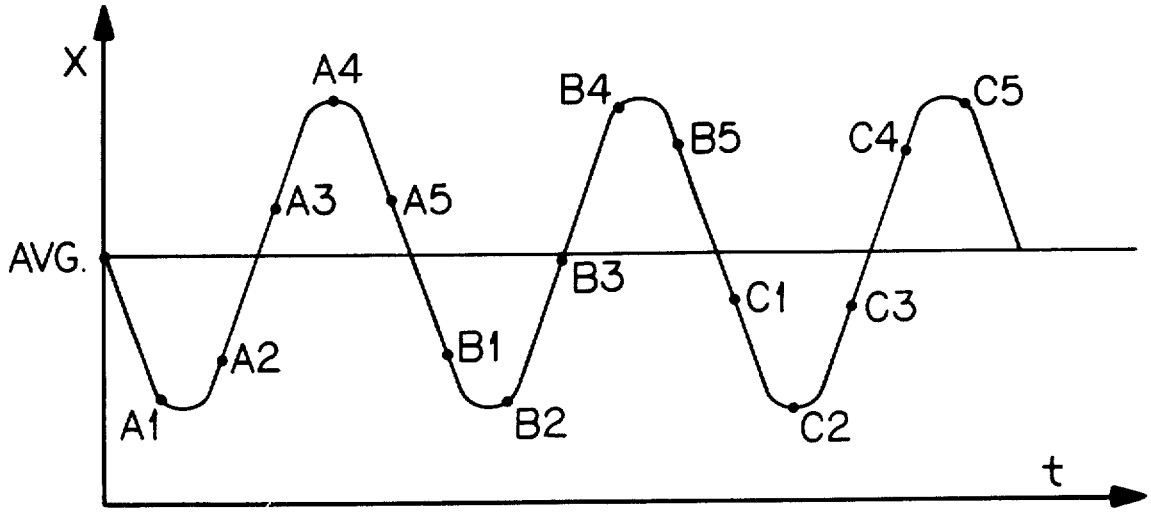
FIG. 1 is a wave form showing the sampling points for the measurement.

If FIG. 1 shows the periodic variable, which may be current or voltage as it varies with time, it will be evident that the first series of samples A1–A5 are obtained from a part of the wave form which is different from that of the samples B1–B5, both of which are in turn different from the samples C1–C5. Thus, as each period passes the point of sampling slips with respect to the wave form in FIG. 1 so that over a number of cycles each part of the wave is sampled.

If the frequency of the wave of FIG. 1 is 60 hertz, then the period of an ideal sine wave would be 16.667 msec. and the sample period could be 3.125 msec. for 5 samples per cycle. If, for example, an RMS calculation of the voltage is desired it may be carried out as follows:

$$E = \left[\frac{1}{T}\int_0^T e^2 dt\right]^{\frac{1}{2}} \approx \left[\frac{1}{T}\sum_{n=1}^{N} e^2 \frac{T}{N}\right]^{\frac{1}{2}} \approx \left[\sum_{n=1}^{N} \frac{e_n^2}{N}\right]^{\frac{1}{2}}$$

Similarly, the equation for RMS current becomes:

$$I \approx \left[\sum_{n=1}^{N} \frac{i_n^2}{N}\right]^{\frac{1}{2}}$$

The variables e and i represent the instantaneous ac voltage and current which are taken from potential and current transformers by way of analog to digital converters. Thus in FIG. 2 the analog to digital converters 12, 14, 16, and 18 provide voltage and current inputs to the microprocessor 20.

The microprocessor 20 may advantageously have connected to it the read only memory (ROM) 22, and the random access memory (RAM) 24 as well as clock source and a power supply so the microprocessor can perform the necessary calculations.

Figure 2:
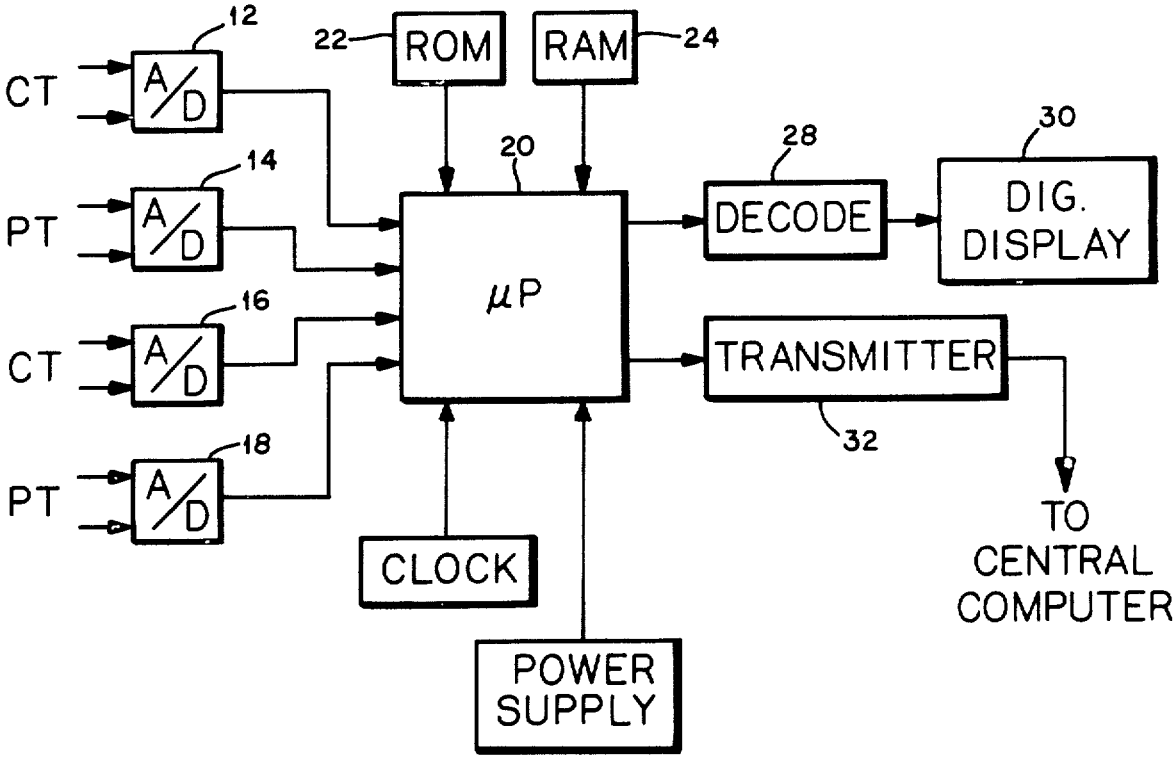
FIG. 2 is a block diagram showing one form the microprocessor configuration can take for carrying out the method of this invention.

The results of the calculated values produced by the microprocessor can be decoded directly by the decoder 28 and supplied to a digital display 30 for displaying the value of the parameter. Also, as shown in FIG. 2 the output of the microprocessor can be transmitted by transmitter 32 to a central computer which may be processing the data obtained.

Other measurements which can be made advantageously in accordance with this novel method are average power and energy.

Average power is defined as follows:

$$P = \frac{1}{T} \int_{o}^{T} ei\, dt \simeq$$

$$\sum_{n=1}^{N} (ei)n \simeq \frac{1}{4N}\left[\sum_{n=1}^{N} (e + i)_n^2 - \sum_{n=1}^{N} (e - i)_n^2\right]$$

Thus, a product of two numbers can be evaluated by a table look-up approach with a suitable shift instruction for the factor $\frac{1}{4}N$.

Energy is defined as follows:

$$W = \int_{o}^{T} ei\, dt \simeq \frac{T}{N} \sum_{n=1}^{N} (ei)_n \simeq PT$$

This relationship represents the energy for a given time period (T) which is directly related to the sample period and the number of samples.

What is claimed is:

1. The method for measuring a parameter whose value is calculable as the integral with time of a function *other than the identity function of a single variable* of at least one variable which has a value following a periodic wave form, comprising the steps of:

sampling the value of said variable periodically at a frequency asynchronous with said wave form *and not a harmonic or subharmonic of the waveform*; and periodically calculating the value of the integral of the function in accordance with the sum of the values for the function determined in accordance with the values of all of the samples taken during the time between said calculations.

2. The method as set forth in claim 1 in which the parameter is RMS voltage, the variable is the instantaneous voltage e for each sample, and the function of the variable is $e^2$.

3. The method set forth in claim 1 in which the parameter is RMS current, the variable is the instantaneous current i for each sample, and the function of the variable is $i^2$.

4. The method set forth in claim 1 in which the parameter is average power, the variables are e and i for each sample, and the function of the variables is ei.

5. The method set forth in claim 1 in which the parameter is energy for a period T, the variables are e and i for each sample, and the function of those variables is ei.

* * * * *